US012580016B2

(12) United States Patent
Yang et al.

(10) Patent No.: US 12,580,016 B2
(45) Date of Patent: Mar. 17, 2026

(54) MEMORY DEVICE

(71) Applicants: TAIWAN SEMICONDUCTOR MANUFACTURING COMPANY, LTD., Hsinchu (TW); TSMC NANJING COMPANY LIMITED, Nanjing (CN)

(72) Inventors: Zhou Yang, Lu'an (CN); Ying-Jhih Shih, Taichung City (TW); Chien-Yu Huang, Taoyuan City (TW); Jun-Cheng Liu, Nanjing City (CN); Ching-Wei Wu, Nantou County (TW)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 450 days.

(21) Appl. No.: 18/343,675

(22) Filed: Jun. 28, 2023

(65) Prior Publication Data

US 2024/0412777 A1     Dec. 12, 2024

(30) Foreign Application Priority Data

Jun. 8, 2023     (CN) ......................... 202310678305.7

(51) Int. Cl.
*G11C 11/419*     (2006.01)
*G11C 11/4094*     (2006.01)
(52) U.S. Cl.
CPC ........ *G11C 11/419* (2013.01); *G11C 11/4094* (2013.01)

(58) Field of Classification Search
CPC ... G11C 11/419; G11C 11/4094; G11C 5/063; G11C 5/14; G11C 11/412; G11C 11/417; H03K 19/01721
See application file for complete search history.

(56) References Cited

U.S. PATENT DOCUMENTS

| | | | | |
|---|---|---|---|---|
| 9,916,892 B1 * | 3/2018 | Raj | ......................... | G11C 11/419 |
| 2002/0149112 A1 * | 10/2002 | Houston | ............. | H01L 23/5223 |
| | | | | 257/758 |
| 2006/0039180 A1 | 2/2006 | Kawasumi | | |
| 2009/0207675 A1 * | 8/2009 | Kengeri | ................ | G11C 11/417 |
| | | | | 365/189.14 |
| 2010/0208529 A1 * | 8/2010 | Kenkare | ................ | G11C 5/147 |
| | | | | 365/189.09 |
| 2010/0246298 A1 * | 9/2010 | Zhang | ................... | G11C 29/021 |
| | | | | 365/201 |
| 2010/0329044 A1 * | 12/2010 | Yeung | ....................... | G11C 8/16 |
| | | | | 365/189.16 |
| 2013/0176796 A1 * | 7/2013 | Tanabe | ................... | G11C 11/419 |
| | | | | 365/189.011 |
| 2014/0160871 A1 * | 6/2014 | Zimmer | ................ | G11C 11/419 |
| | | | | 365/189.16 |
| 2015/0076575 A1 * | 3/2015 | Wu | .......................... | H10D 1/66 |
| | | | | 257/296 |

(Continued)

*Primary Examiner* — Jay W. Radke
(74) *Attorney, Agent, or Firm* — Maschoff Brennan

(57) ABSTRACT

A memory device is provided, including at least one inverter, a transistor coupled between the at least one inverter and a bit line, and an assist circuit coupled to the bit line, configured to provide a negative voltage to the bit line, and configured to pull down a power supply voltage provided to the at least one inverter.

20 Claims, 4 Drawing Sheets

100

BL  VDD  BLB
101
110
105
P2
PU1  PU2  WL(1)
PG2
Q  PG1  P1
PD1  PD2  QB
111  113

VDD
110
105
PU1  PU2  WL(n)
Q  PG1  PG2  QB
PD1  PD2
111  113
T7  WC  WT  T8

NVSS
120
1232
1227
1231 1211 1212 1213 1214
1221 1222 1223 1224 1225 1226
VDD VNBL

(56)     References Cited

U.S. PATENT DOCUMENTS

| | | | |
|---|---|---|---|
| 2016/0118091 A1* | 4/2016 | Asenov | G11C 11/418 |
| | | | 365/194 |
| 2016/0196871 A1* | 7/2016 | Liaw | G11C 11/419 |
| | | | 365/154 |
| 2018/0102181 A1* | 4/2018 | Katoch | G11C 29/28 |
| 2019/0069392 A1* | 2/2019 | Huang | H05K 1/0245 |
| 2022/0036942 A1 | 2/2022 | Wang et al. | |
| 2024/0420748 A1* | 12/2024 | Erbagci | G11C 7/12 |

* cited by examiner

MEMORY DEVICE

BACKGROUND

The present application claims priority to China Application Serial Number 202310678305.7, filed Jun. 8, 2023, which is herein incorporated by reference.

BACKGROUND

Static random access memory (SRAM) with high-density bit-cell needs to adopt negative bit-line (NBL) scheme for maintaining its write capability. However, adopting NBL scheme in SRAM will increase the power consumption of the SRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
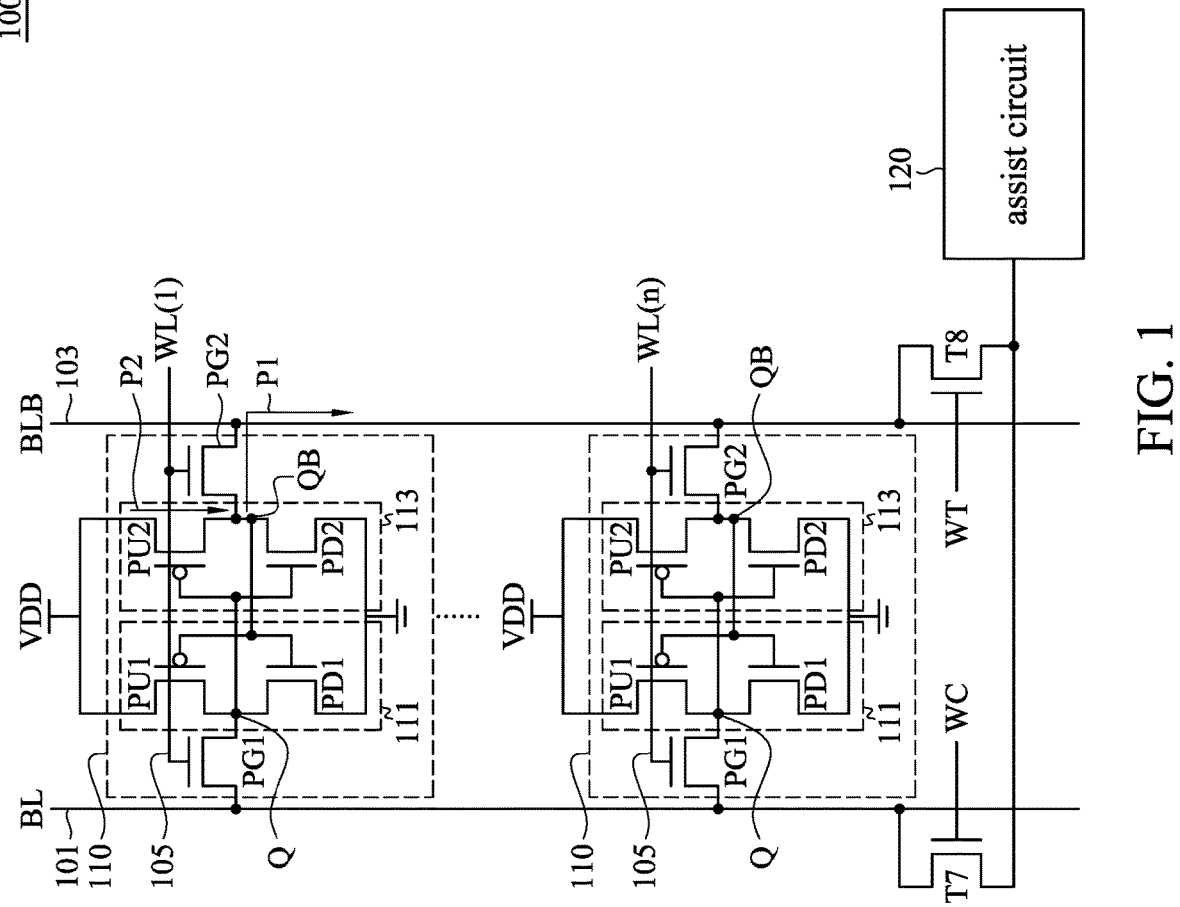
FIG. 1 is a schematic diagram of part of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of part of a memory device 100, in accordance with some embodiments of the present disclosure. For illustration, the memory device 100 includes a number of memory cells 110 and an assist circuit 120. The assist circuit 120 is coupled to the memory cells 110.

In some embodiments, the memory cells 110 are arranged by columns and rows in a memory cell array (not shown in figures). For illustrative purposes, only two memory cells 110 coupled to bit lines 101 and 103 to receive bit line signals BL and BLB are illustrated in FIG. 1. Various numbers of the memory cells 110 are within the contemplated scope of the present disclosure.

In some embodiments, the memory cell 110 includes an inverter 111 and an inverter 113. The inverter 111 and the inverter 113 are cross-coupled. Effectively, the inverter 111 and the inverter 113 operate as a data latch. For illustration, an output node of the inverter 111 and an input node of the inverter 113 are connected together at a node Q shown in FIG. 1. An input node of the inverter 111 and an output node of the inverter 113 are connected together at a node QB shown in FIG. 1.

For illustration of operation, the data latch, including the inverter 111 and the inverter 113, is able to store a bit of data at the node Q. For illustration, a voltage level on the node Q is able to be configured at different voltage levels. The voltage level of the node Q represents logic "1" or logic "0" corresponding to logic data stored in the memory cell 110. The node QB has a logical level opposite to that of the node Q. For convenience of illustration hereinafter, logic "0" indicates a low level, and logic "1" indicates a high level. The indications are given for illustrative purposes. Various indications are within the contemplated scope of the present disclosure.

In some embodiments, the memory cell 110 illustrated in FIG. 1 is a static random-access memory (SRAM) cell, including, for illustration, six transistors PU1-PU2, PD1-PD2 and PG1-PG2. The pull up transistor PU1 and the pull down transistor PD1 are configured and operate as the inverter 111. The pull up transistor PU2 and the pull down transistor PD2 are configured and operate the inverter 113. In some embodiments, the pull down transistors PD1-PD2 and the pass gate transistors PG1-PG2 are N-type transistors, and the pull up transistors PU1-PU2 are P-type transistors.

In some embodiments, the transistor PG1 is configured as a first pass gate transistor, and the transistor PG2 is configured as a second pass gate transistor. For illustration, gate terminals of the transistor PG1 and the transistor PG2 are coupled to the word line 105 and controlled by the word line signals WL(1)~WL(n). The output node of the inverter 111 and the input node of the inverter 113, i.e., the node Q, are coupled through the transistor PG1 to the bit line 101 carrying the bit line signal BL. The input node of the inverter 111 and the output node of the inverter 113, i.e., the node QB, are coupled through the transistor PG2 to the complementary bit line 103 carrying the complementary bit line signal BLB.

In some embodiments, the memory device 100 includes multiple memory cells 110, and the word line signals, for example, WL(1)~WL(n) are utilized to select and trigger at least one of the memory cells 110 for a write/read operation of the memory device 100. When the memory cell 110 is not selected in response to the corresponding word line signal, the memory cell 110 maintains the same voltage levels on the node Q and the node QB.

For illustration of operation, the assist circuit 120 is configured to provide negative voltages to the bit lines 101 and 103 for assisting the writing operation of the memory device 100. For example, during the writing operation of the memory device 100, the voltage stored in the node QB is pulled down through a current path P1, and the node QB is therefore written to be logic "0".

For enhancing the writing capability of the memory device 100 during the writing operation, the assist circuit 120 is configured to provide the negative voltage to the bit line 103 so as to increase a voltage difference between the node QB and the bit line 103, and the discharging capability through the current path P1 is therefore enhanced, such that the node QB is written to be logic "0" efficiently. As mentioned above, the writing capability of the memory device 100 is improved because the discharging capability from the node QB to the bit line 103 enhances in response to the negative voltage being provided to the bit line 103.

In some embodiments, the memory cell 110 includes a control transistor T7 and a control transistor T8. The control transistor T7 is coupled between the assist circuit 120 and the bit line 101, and the control transistor T8 is coupled between the assist circuit 120 and the bit line 103. For illustration of operation, the control transistor T7 is configured to transmit the negative voltage provided by the assist circuit 120 to the bit line 101 in response to a control signal WC. The control transistor T8 is configured to transmit the negative voltage provided by the assist circuit 120 to the bit line 103 in response to a control signal WT.

For illustration of operation, the assist circuit 120 is configured to pull down a power supply voltage VDD provided to the inverter 111 and the inverter 113. For example, during the writing operation of the memory device 100, the assist circuit 120 is configured to pull down the power supply voltage VDD provided to the inverter 111 and the inverter 113, and a charging capability through a current path P2 decreases. Since the charging capability through the current path P2 decreases, the memory device 100 saves power during the writing operation so as to reduce the power consumption of the memory device 100.

In some embodiments, the assist circuit 120 is coupled to the upper side of the inverter 111 and the inverter 113. During the writing operation of the memory device 100, the assist circuit 120 is therefore configured to pull down the power supply voltage VDD provided to the upper side of the inverter 111 and the inverter 113.

In some embodiments, the assist circuit 120 illustrated in FIG. 1 is a pull down circuit. For illustration of operation, the pull down circuit 120 is configured to pull down a voltage stored in the node QB, and the pull down circuit 120 is configured to pull down a voltage provided to the inverter 111 and the inverter 113. For example, the pull down circuit 120 is configured to pull down the power supply voltage VDD provided to the inverter 111 and the inverter 113.

For illustration of operation, the pull down circuit 120 is configured to pull down the voltage stored in the node QB and the voltage provided to the inverter 111 and the inverter 113 independently. In various embodiments, the pull down circuit 120 is configured to pull down the voltage stored in the node QB and the second voltage provided to the inverter 111 and the inverter 113 simultaneously.

In some embodiments, the pull down circuit 120 is configured to pull down the voltage stored in the node QB and the voltage provided to the inverter 111 and the inverter 113 independently or simultaneously according to the actual practice of the present application.

In some embodiments, a current outputted from the node QB through the current path P1 rises in response to the voltage stored in the node QB being pulled down by the pull down circuit 120. In various embodiments, a current inputted into the node QB through the current path P2 decreases in response to the voltage provided to the inverter 111 and the inverter 113 being pulled down by the pull down circuit 120.

The configurations of FIG. 1 are given for illustrative purposes. Various implements are within the contemplated scope of the present disclosure. For example, in some embodiments, the pull down circuit 120 is configured to pull down the voltage stored in the node QB and the voltage provided to the inverter 111 and the inverter 113 in sequence. For example, in some embodiments, the pull down circuit 120 is configured to pull down the voltage stored in the node QB firstly, and the pull down circuit 120 is configured to pull down the voltage provided to the inverter 111 and the inverter 113 secondly. For example, in some embodiments, the pull down circuit 120 is configured to pull down the voltage provided to the inverter 111 and the inverter 113 firstly, and the pull down circuit 120 is configured to pull down the voltage stored in the node QB secondly according to the actual practice of the present application.

Figure 2:
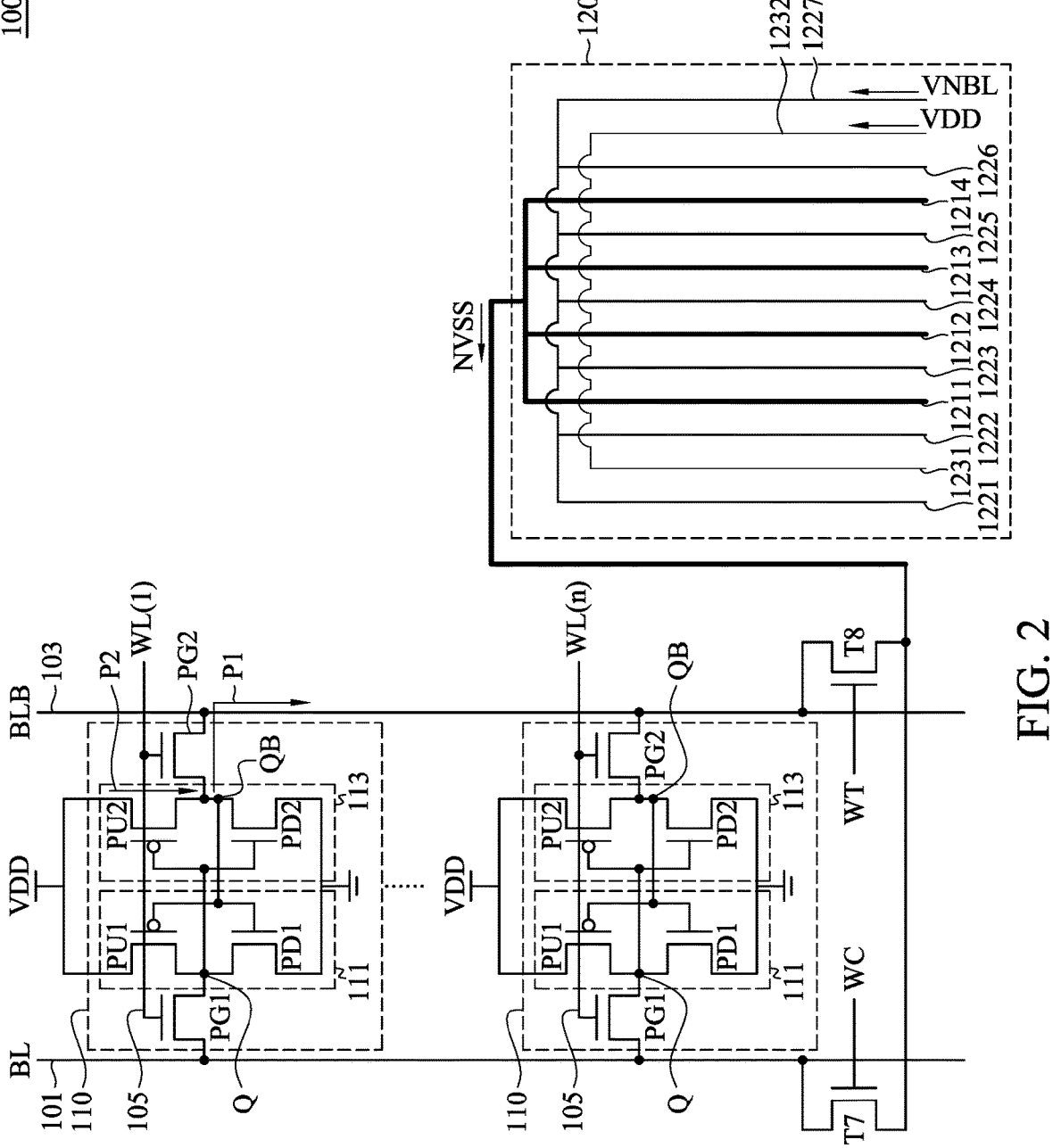
FIG. 2 is a schematic diagram of part of a memory device, in accordance with some embodiments of the present disclosure.

Reference is now made to FIG. 2. FIG. 2 is a schematic diagram of part of the memory device 100 in FIG. 1 having structures of the assist circuit 120, in accordance with some embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2.

In some embodiments, the assist circuit 120 includes a plurality of first traces 1211~1214 and a plurality of second traces 1221~1227. The plurality of first traces 1211~1214 are coupled to the bit lines 101 and 103 through the control transistor T7 and the control transistor T8 respectively. The plurality of second traces 1221~1227 are disposed adjacent to the plurality of first traces 1211~1214, and configured to couple the negative voltage to the plurality of first traces 1211~1214.

In some embodiments, part of the plurality of second traces 1221~1227 are directly disposed adjacent to the plurality of first traces 1211~1214. For example, the second traces 1222~1226 are directly disposed adjacent to the plurality of first traces 1211~1214. In various embodiments, the second trace 1222 of the plurality of second traces 1221~1227 is directly disposed adjacent to the first trace 1211 of the plurality of first traces 1211~1214, the second trace 1223 of the plurality of second traces 1221~1227 is directly disposed adjacent to the first traces 1211 and 1212 of the plurality of first traces 1211~1214, the second trace 1224 of the plurality of second traces 1221~1227 is directly disposed adjacent to the first traces 1212 and 1213 of the plurality of first traces 1211~1214, the second trace 1225 of the plurality of second traces 1221~1227 is directly disposed adjacent to the first traces 1213 and 1214 of the plurality of first traces 1211~1214, and the second trace 1226 of the plurality of second traces 1221~1227 is directly disposed adjacent to the first trace 1214 of the plurality of first traces 1211~1214.

Figure 3:
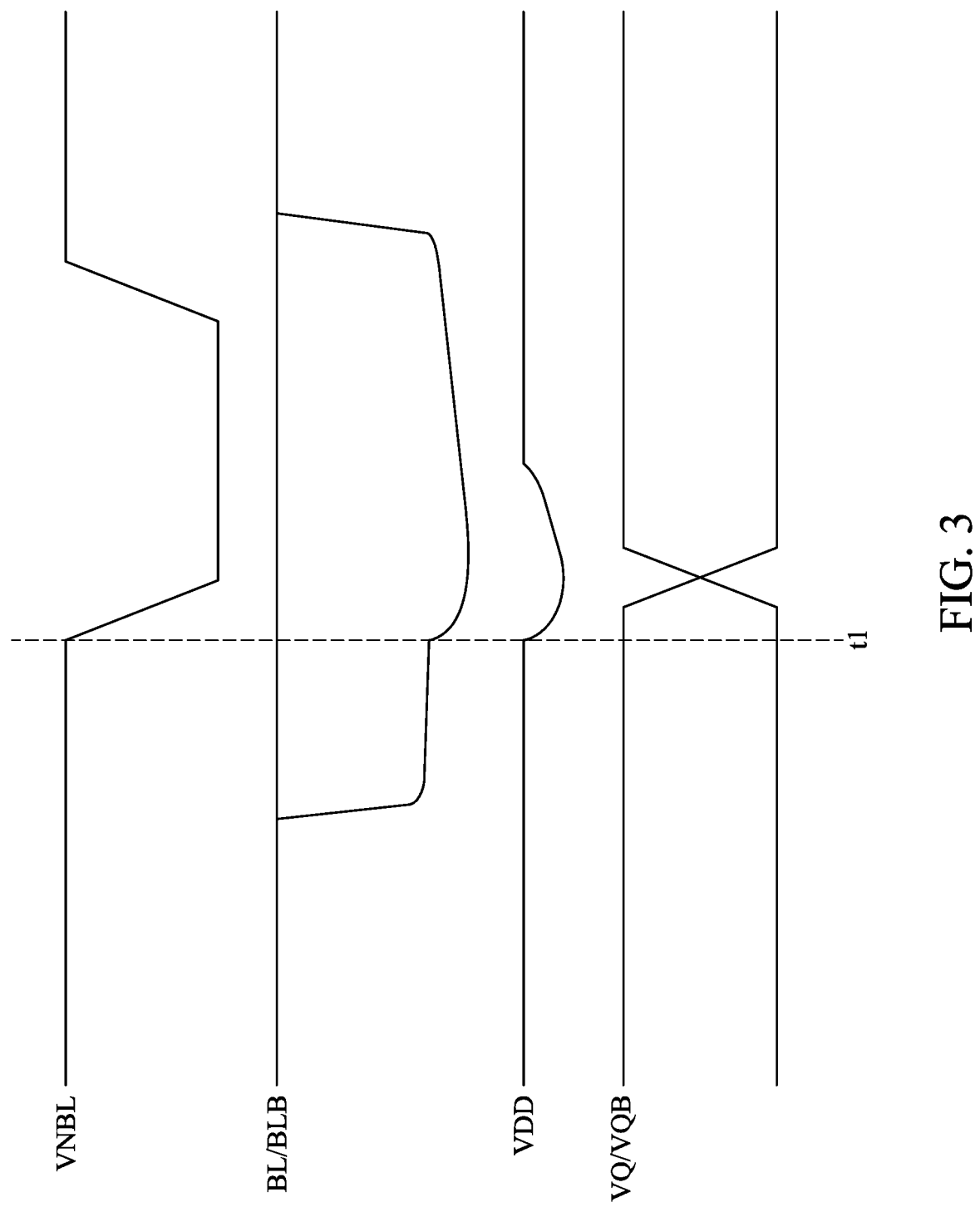
FIG. 3 illustrates waveforms of signals in the memory device corresponding to FIGS. 1-2, in accordance with some embodiments of the present disclosure.

For operation of the memory device 100, reference is now made to FIG. 3. FIG. 3 illustrates waveforms of signals in the memory device 100 corresponding to FIGS. 1-2, in accordance with some embodiments of the present disclosure.

For illustration of operation, when the assist circuit 120 is configured to provide the negative voltages NVSS to the bit lines 101 and 103 for assisting the writing operation of the memory cell 110, the plurality of second traces 1221~1227 couple the negative voltages NVSS to the plurality of first traces 1211~1214 in response to a negative bit line signal VNBL shown in FIG. 3, such that the plurality of first traces 1211~1214 provide the negative voltages NVSS to the bit lines 101 and 103. As illustratively shown in the embodiments of FIG. 3, at time t1, the voltage level of the negative bit line signal VNBL provided to the plurality of second traces 1221~1227 is changed from a high voltage level to a low voltage level, and the plurality of second traces 1221~1227 therefore couple the negative voltage in connection with the voltage level change to the plurality of first traces 1211~1214. Subsequently, the plurality of first traces 1211~1214 provide the negative voltages NVSS to the bit lines 101 and 103 carrying the bit line signals BL and BLB. As illustratively shown in the embodiment of FIG. 3, one of the bit line signals BL or BLB is therefore pulled down in response to the negative voltage NVSS provided by the plurality of first traces 1211~1214.

In various embodiments, when the assist circuit 120 is configured to provide the negative voltages NVSS to the bit lines 101 and 103 for assisting the writing operation of the memory cell 110, part of the plurality of second traces 1221~1227 couple the negative voltages NVSS to the plurality of first traces 1211~1214 in response to the negative bit line signal VNBL shown in FIG. 3, and the plurality of first traces 1211~1214 provide the negative voltages NVSS to the bit lines 101 and 103. For example, the second traces 1222~1226 of the plurality of second traces 1221~1227 couple the negative voltages NVSS to the plurality of first traces 1211~1214 because the second traces 1222~1226 of the plurality of second traces 1221~1227 are directly adjacent to the plurality of first traces 1211~1214.

In some embodiments, the assist circuit 120 further includes a plurality of third traces 1231 and 1232. The plurality of third traces 1231 and 1232 are disposed adjacent to the plurality of second traces 1221~1227. In various embodiments, the plurality of third traces 1231 and 1232 are directly disposed adjacent to part of the plurality of second traces 1221~1227. For example, the plurality of third traces 1231 and 1232 are directly disposed adjacent to the second traces 1221, 1222, 1226, and 1227 of the plurality of second traces 1221~1227.

In some embodiments, each of the plurality of third traces 1231 and 1232 is directly disposed adjacent to part of the plurality of second traces 1221~1227. For example, the third trace 1231 of the plurality of third traces 1231 and 1232 is directly disposed adjacent to the second traces 1221 and 1222 of the plurality of second traces 1221~1227, and the third trace 1232 of the plurality of third traces 1231 and 1232 is directly disposed adjacent to the second traces 1226 and 1227 of the plurality of second traces 1221~1227.

For illustration of operation, when the assist circuit 120 is configured to pull down the power supply voltage VDD provided to the inverter 111 and the inverter 113, the plurality of second traces 1221~1227 are configured to couple the negative voltage to the plurality of third traces 1231 and 1232, and the plurality of third traces 1231 and 1232 pull down the power supply voltage VDD provided to the inverter 111 and the inverter 113. For example, the plurality of second traces 1221~1227 are configured to couple the negative voltages to the plurality of third traces 1231 and 1232 in response to the negative bit line signal VNBL. Subsequently, the plurality of third traces 1231 and 1232 pull down the power supply voltage VDD provided to the inverter 111 and the inverter 113.

As illustratively shown in the embodiments of FIG. 3, at time t1, the voltage level of the negative bit line signal VNBL provided to the plurality of second traces 1221~1227 is changed from the high voltage level to the low voltage level, and the plurality of second traces 1221~1227 therefore couple the negative voltage in connection with the voltage level change to the plurality of third traces 1231 and 1232 respectively. Subsequently, the plurality of third traces 1231 and 1232 pull down the power supply voltage VDD provided to the inverter 111 and the inverter 113. As illustratively shown in the embodiments of FIG. 3, the power supply voltage VDD provided to the inverter 111 and the inverter 113 is therefore pulled down.

For illustration of operation, when the assist circuit 120 is configured to pull down the power supply voltage VDD provided to the inverter 111 and the inverter 113, part of the plurality of second traces 1221~1227 couple the negative voltage to the third traces 1231 and 1232, and the third traces 1231 and 1232 pull down the power supply voltage VDD provided to the inverter 111 and the inverter 113. For example, the second trace 1221 of the plurality of second traces 1221~1227 is configured to couple the negative voltage to the third trace 1231 of the plurality of third traces 1231 and 1232 in response to the negative bit line signal VNBL because the second trace 1221 is directly disposed adjacent to the third trace 1231. The second trace 1227 of the plurality of second traces 1221~1227 is configured to couple the negative voltage to the third trace 1232 of the plurality of third traces 1231 and 1232 in response to the negative bit line signal VNBL because the second trace 1227 is directly disposed adjacent to the third trace 1232. Subsequently, the plurality of third traces 1231 and 1232 pull down the power supply voltage VDD provided to the inverter 111 and the inverter 113.

As illustratively shown in the embodiments of FIG. 3, at time t1, the voltage level of the negative bit line signal VNBL provided to the plurality of second traces 1221~1227 is changed from the high voltage level to the low voltage level, and the second traces 1221 and 1227 of the plurality of second traces 1221~1227 therefore couple the negative voltage in connection with the voltage level change to the plurality of third traces 1231 and 1232 respectively because the second traces 1221 and 1227 are directly disposed adjacent to the third traces 1231 and 1232. Subsequently, the plurality of third traces 1231 and 1232 pull down the power supply voltage VDD provided to the inverter 111 and the inverter 113. As illustratively shown in the embodiments of FIG. 3, the power supply voltage VDD provided to the inverter 111 and the inverter 113 is therefore pulled down.

In some embodiments, the third traces 1231 and 1232 of the assist circuit 120 are coupled to the upper side of the inverter 111 and the inverter 113. During the writing operation of the memory device 100, when the assist circuit 120 is configured to pull down the power supply voltage VDD provided to the upper side of the inverter 111 and the inverter 113, the plurality of second traces 1221~1227 are configured to couple the negative voltage to the plurality of third traces 1231 and 1232, and the plurality of third traces 1231 and 1232 pull down the power supply voltage VDD provided to the upper side of the inverter 111 and the inverter 113.

In some embodiments, as illustratively shown in the embodiments of FIG. 3, logical levels of data VQ and VQB stored in the nodes Q and QB change after the memory device 100 performs the writing operation.

The configurations of FIGS. 2 and 3 are given for illustrative purposes. Various implements are within the contemplated scope of the present disclosure. The skilled person in the art can adjust the structure of the assist circuit 120 according to the actual practice of the present application.

Figure 4:
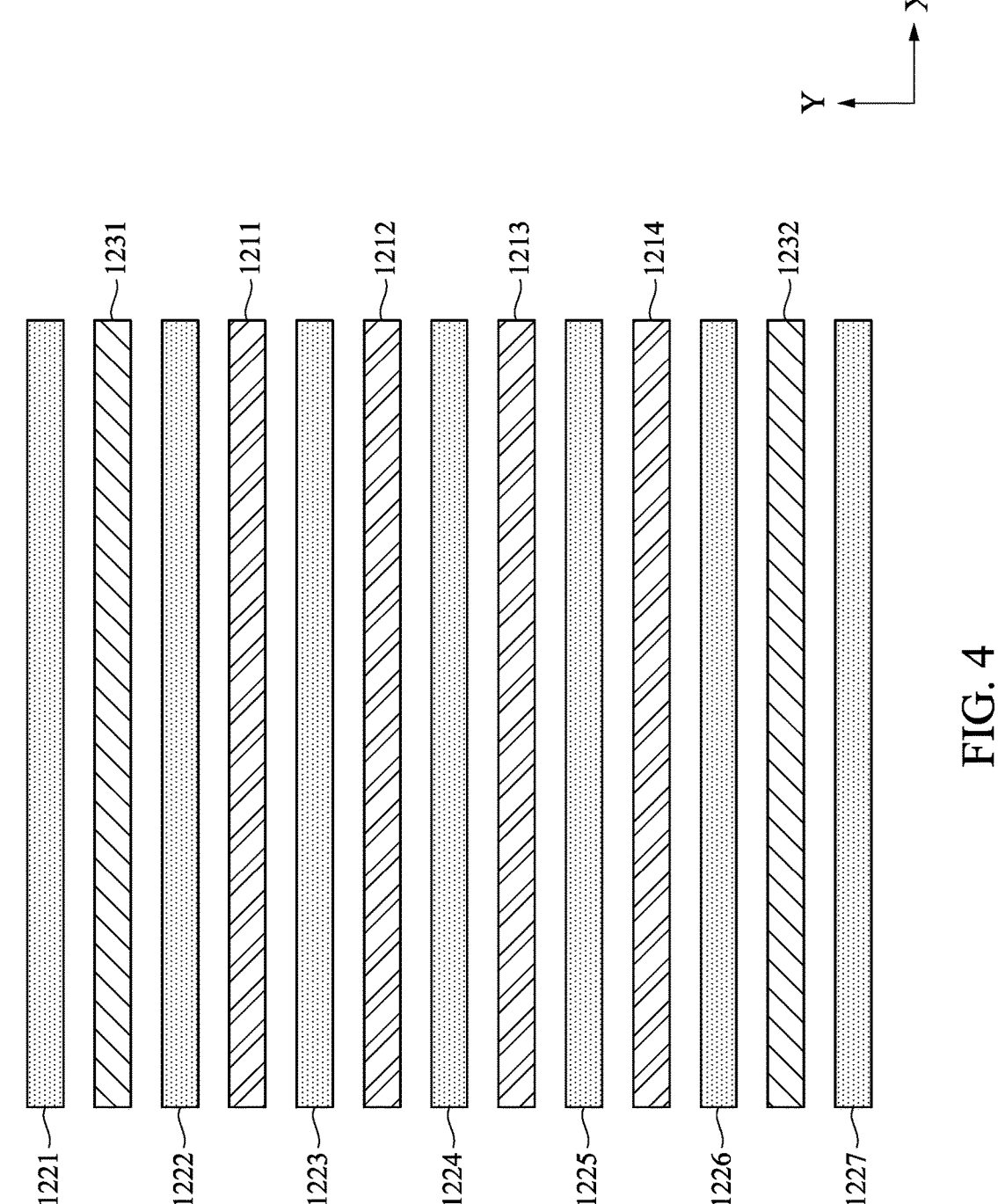
FIG. 4 is a schematic diagram of an assist circuit of part of a memory device, in accordance with some embodiments of the present disclosure.

Reference is now made to FIG. 4. FIG. 4 is a schematic diagram of the assist circuit 120 in part of the memory device 100 of FIG. 2, in accordance with some embodiments of the present disclosure. With respect to the embodiments of FIG. 2, like elements in FIG. 4 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

In some embodiments, one of the plurality of first traces 1211~1214, one of the plurality of second traces 1221~1227, another one of the plurality of first traces 1211~1214, and another one of the plurality of second traces 1221~1227 are disposed in sequence. For example, the first trace 1211 of the plurality of first traces 1211~1214, the second trace 1223 of the plurality of second traces 1221~1227, the first trace 1212 of the plurality of first traces 1211~1214, and the second trace 1224 of the plurality of second traces 1221~1227 are disposed in sequence. In various embodiments, the first trace 1211, the second trace 1223, the first trace 1212, and the second trace 1224, the first trace 1213, the second trace 1225, the first trace 1214, and the second trace 1226 are disposed in sequence.

In some embodiments, each of the plurality of first traces 1211~1214 is disposed between two of the plurality of second traces 1221~1227. For example, the first trace 1211 of the plurality of first traces 1211~1214 is disposed between the second traces 1222 and 1223 of the plurality of second traces 1221~1227. The first trace 1212 of the plurality of first traces 1211~1214 is disposed between the second traces 1223 and 1224 of the plurality of second traces 1221~1227. The first trace 1213 of the plurality of first traces 1211~1214 is disposed between the second traces 1224 and 1225 of the plurality of second traces 1221~1227. The first trace 1214 of the plurality of first traces 1211~1214 is disposed between the second traces 1225 and 1226 of the plurality of second traces 1221~1227.

In some embodiments, one of the plurality of third traces 1231 and 1232 is disposed between two of the plurality of second traces 1221~1227. For example, the third trace 1231 of the plurality of third traces 1231 and 1232 is disposed between the second traces 1221 and 1222 of the plurality of second traces 1221~1227, and the third trace 1232 of the plurality of third traces 1231 and 1232 is disposed between the second traces 1226 and 1227 of the plurality of second traces 1221~1227.

In some embodiments, one of the plurality of second traces 1221~1227 is disposed at an outermost side of the assist circuit 120. For example, the second trace 1221 of the plurality of second traces 1221~1227 is disposed at an outermost side of the assist circuit 120. For example, the second trace 1221 of the plurality of second traces 1221~1227 is disposed at the top of the assist circuit 120. The second trace 1227 of the plurality of second traces 1221~1227 is disposed at an outermost side of the assist circuit 120. For example, the second trace 1227 of the plurality of second traces 1221~1227 is disposed at the bottom of the assist circuit 120.

In some embodiments, the plurality of first traces 1211~1214 are disposed inside the plurality of third traces 1231 and 1232. For example, the plurality of first traces 1211~1214 are disposed between the plurality of third traces 1231 and 1232.

In some embodiments, one of the plurality of first traces 1211~1214, one of the plurality of second traces 1221~1227, and one of the plurality of third traces 1231 and 1232 are disposed in sequence. For example, the first trace 1214 of the plurality of first traces 1211~1214, the second trace 1226 of the plurality of second traces 1221~1227, and the third trace 1232 of the plurality of third traces 1231 and 1232 are disposed in sequence. In various embodiments, one of the plurality of third traces 1231 and 1232, one of the plurality of second traces 1221~1227, and one of the plurality of first traces 1211~1214 are disposed in sequence. For example, the third trace 1231 of the plurality of third traces 1231 and 1232, the second trace 1222 of the plurality of second traces 1221~1227, and the first trace 1211 of the plurality of first traces 1211~1214 are disposed in sequence.

In some embodiments, part of the plurality of second traces 1221~1227 and all of the plurality of first traces 1211~1214 are disposed in turn. For example, the second traces 1222~1226 of the plurality of second traces 1221~1227 and all of the plurality of first traces 1211~1214 are disposed in turn. In other words, the second trace 1222, the first trace 1211, the second trace 1223, the first trace 1212, the second trace 1224, the first trace 1213, the second trace 1225, the first trace 1214, and the second trace 1226 are disposed in sequence.

In some embodiments, the second trace 1221, the third trace 1231, the second trace 1222, the first trace 1211, the second trace 1223, the first trace 1212, the second trace 1224, the first trace 1213, the second trace 1225, the first trace 1214, and the second trace 1226, the third trace 1232, the second trace 1227 are disposed in sequence.

In some embodiments, the plurality of first traces 1211~1214 are disposed in even rows of the assist circuit 120. For example, the first trace 1211 of the plurality of first traces 1211~1214 is disposed in the fourth row of the assist circuit 120, the first trace 1212 of the plurality of first traces 1211~1214 is disposed in the sixth row of the assist circuit 120, the first trace 1213 of the plurality of first traces 1211~1214 is disposed in the eighth row of the assist circuit 120, and the first trace 1214 of the plurality of first traces 1211~1214 is disposed in the tenth row of the assist circuit 120.

In some embodiments, the plurality of second traces 1221~1227 are disposed in odd rows of the assist circuit 120. For example, the second trace 1221 of the plurality of second traces 1221~1227 is disposed in the first row of the assist circuit 120, the second trace 1222 of the plurality of second traces 1221~1227 is disposed in the third row of the assist circuit 120, the second trace 1223 of the plurality of second traces 1221~1227 is disposed in the fifth row of the assist circuit 120, the second trace 1224 of the plurality of second traces 1221~1227 is disposed in the seventh row of the assist circuit 120, the second trace 1225 of the plurality of second traces 1221~1227 is disposed in the ninth row of the assist circuit 120, the second trace 1226 of the plurality of second traces 1221~1227 is disposed in the eleventh row of the assist circuit 120, and the second trace 1227 of the plurality of second traces 1221~1227 is disposed in the thirteenth row of the assist circuit 120.

In some embodiments, the plurality of third traces 1231 and 1232 are disposed in even rows of the assist circuit 120. For example, the third trace 1231 of the plurality of third traces 1231 and 1232 is disposed in the second row of the assist circuit 120, and the third trace 1232 of the plurality of third traces 1231 and 1232 is disposed in the twelfth row of the assist circuit 120.

In some embodiments, the plurality of first traces 1211~1214 are disposed along X direction. The plurality of second traces 1221~1227 are disposed along X direction. The plurality of third traces 1231 and 1232 are disposed along X direction.

In some embodiments, the plurality of first traces 1211~1214 are coupled to each other. The plurality of second traces 1221~1227 are coupled to each other. The plurality of third traces 1231 and 1232 are coupled to each other. In various embodiments, the plurality of first traces 1211~1214 are not coupled to the plurality of second traces 1221~1227. The plurality of first traces 1211~1214 are not coupled to the plurality of third traces 1231 and 1232. The plurality of second traces 1221~1227 are not coupled to the plurality of third traces 1231 and 1232.

In some embodiments, the plurality of first traces 1211~1214, the plurality of second traces 1221~1227, and the plurality of third traces 1231 and 1232 are located on the same layer.

In some embodiments, the plurality of first traces 1211~1214, the plurality of second traces 1221~1227, and the plurality of third traces 1231 and 1232 are made of metal. In various embodiments, the plurality of first traces

1211~1214, the plurality of second traces 1221~1227, and the plurality of third traces 1231 and 1232 are made of copper.

In some embodiments, the plurality of first traces 1211~1214, the plurality of second traces 1221~1227, and the plurality of third traces 1231 and 1232 are metal capacitor. Compared with utilizing Metal-Oxide-Semiconductor (MOS) capacitor, the memory device 100 efficiently saves areas by utilizing metal capacitor with a plurality of traces.

The configurations of FIG. 4 are given for illustrative purposes. Various implements are within the contemplated scope of the present disclosure. The skilled person in the art can adjust the structure of the assist circuit 120 according to the actual practice of the present application.

Based on the discussion above, the present application provides a memory device. By enhancing discharging capability from storing nodes of the memory device to bit lines in response to negative voltages being provided to the bit lines, the writing capability of the memory device is improved. Furthermore, since charging capability to storing nodes of the memory device decreases, the memory device saves power during the writing operation so as to reduce the power consumption of the memory device. Moreover, by utilizing a circuit with a plurality of traces to assist the writing capability of the memory device, the memory device efficiently saves areas compared with some approaches.

According to some embodiments of the present disclosure, a memory device is provided, including at least one inverter, a transistor coupled between the at least one inverter and a bit line, and an assist circuit coupled to the bit line, configured to provide a negative voltage to the bit line, and configured to pull down a power supply voltage provided to the at least one inverter.

In some embodiments, the assist circuit includes a plurality of first traces coupled to the bit line and a plurality of second traces disposed adjacent to the plurality of first traces and configured to couple the negative voltage to the plurality of first traces.

In some embodiments, one of the plurality of first traces, one of the plurality of second traces, another one of the plurality of first traces, and another one of the plurality of second traces are disposed in sequence.

In some embodiments, each of the plurality of first traces is disposed between two of the plurality of second traces.

In some embodiments, the assist circuit includes a plurality of first traces configured to couple the negative voltage to the bit line and at least two second traces disposed adjacent to the plurality of first traces. The plurality of first traces are configured to couple the negative voltage to the at least two second traces, and the at least two second traces pull down the power supply voltage provided to the at least one inverter.

In some embodiments, one of the at least two second traces is disposed between two of the plurality of first traces.

In some embodiments, the assist circuit includes a plurality of first traces coupled to the bit line, a plurality of second traces disposed adjacent to the plurality of first traces and configured to couple the negative voltage to the plurality of first traces, and at least two third traces disposed adjacent to the plurality of second traces. The plurality of first traces are disposed inside the at least two third traces.

In some embodiments, one of the plurality of second traces is disposed at an outermost side of the assist circuit.

In some embodiments, one of the at least two third traces, one of the plurality of second traces, and one of the plurality of first traces are disposed in sequence.

According to some embodiments of the present disclosure, a memory device is provided, including a pull up transistor configured to receive a power supply voltage, a pull down transistor coupled to the pull up transistor at a node, a pass gate transistor coupled between the node and a bit line, and an assist circuit including at least one first trace coupled to the bit line, at least one second trace configured to couple a negative voltage to the at least one first trace, and at least one third trace configured to adjust the power supply voltage in response to the negative voltage provided by the at least one second trace.

In some embodiments, the least one second trace is further configured to couple the negative voltage to the at least one third trace, and the at least one third trace is configured to decrease the power supply voltage in response to the negative voltage provided by the at least one second trace.

In some embodiments, the at least one second trace is disposed between the at least one first trace and the at least one third trace.

In some embodiments, the at least one first trace, the at least one second trace, and the at least third trace are disposed in sequence.

In some embodiments, the at least one second trace includes a plurality of second traces, and one of the plurality of second traces is disposed at an outermost side of the assist circuit.

In some embodiments, the at least one first trace is disposed between two of the plurality of second traces.

In some embodiments, the at least one third trace is disposed between two of the plurality of second traces.

According to some embodiments of the present disclosure, a memory device is provided, including a first inverter, a second inverter coupled to the first inverter at a node, and a pull down circuit configured to pull down a first voltage of the node and configured to pull down a second voltage provided to the first inverter and the second inverter.

In some embodiments, the pull down circuit is configured to pull down the first voltage and the second voltage independently.

In some embodiments, the pull down circuit is configured to pull down the first voltage and the second voltage simultaneously.

In some embodiments, a first current outputted from the node rises in response to the first voltage of the node being pulled down, and a second current inputted into the node decreases in response to the second voltage provided to the first inverter and the second inverter being pulled down.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
at least one inverter;
a transistor coupled between the at least one inverter and a bit line; and
an assist circuit coupled to the bit line by a control transistor, the assist circuit configured to provide a negative voltage to the bit line through the control transistor, and configured to pull down a power supply voltage provided to the at least one inverter.

2. The memory device of claim 1, wherein the assist circuit comprises:
a plurality of first traces coupled to the bit line; and
a plurality of second traces disposed adjacent to the plurality of first traces and configured to couple the negative voltage to the plurality of first traces.

3. The memory device of claim 2, wherein one of the plurality of first traces, one of the plurality of second traces, another one of the plurality of first traces, and another one of the plurality of second traces are disposed in sequence.

4. The memory device of claim 2, wherein each of the plurality of first traces is disposed between two of the plurality of second traces.

5. The memory device of claim 1, wherein the assist circuit comprises:
a plurality of first traces configured to couple the negative voltage to the bit line; and
at least two second traces disposed adjacent to the plurality of first traces, wherein the at least two second traces are configured to couple the negative voltage to the plurality of first traces, and the at least two second traces pull down the power supply voltage provided to the at least one inverter.

6. The memory device of claim 5, wherein one of the at least two second traces is disposed between two of the plurality of first traces.

7. The memory device of claim 1, wherein the assist circuit comprises:
a plurality of first traces coupled to the bit line;
a plurality of second traces disposed adjacent to the plurality of first traces and configured to couple the negative voltage to the plurality of first traces; and
at least two third traces disposed adjacent to the plurality of second traces, wherein the plurality of first traces are disposed inside the at least two third traces.

8. The memory device of claim 7, wherein one of the plurality of second traces is disposed at an outermost side of the assist circuit.

9. The memory device of claim 7, wherein one of the plurality of first traces, one of the plurality of second traces, and one of the at least two third traces are disposed in sequence.

10. A memory device, comprising:
a pull up transistor configured to receive a power supply voltage;
a pull down transistor coupled to the pull up transistor at a node;
a pass gate transistor coupled between the node and a bit line; and
an assist circuit coupled to the bit line by a control transistor, the assist circuit comprising:
at least one first trace coupled to the bit line through the control transistor;
at least one second trace configured to couple a negative voltage to the at least one first trace; and
at least one third trace configured to adjust the power supply voltage in response to the negative voltage provided by the at least one second trace.

11. The memory device of claim 10, wherein the at least one second trace is further configured to couple the negative voltage to the at least one third trace, and the at least one third trace is configured to decrease the power supply voltage in response to the negative voltage provided by the at least one second trace.

12. The memory device of claim 10, wherein the at least one second trace is disposed between the at least one first trace and the at least one third trace.

13. The memory device of claim 10, wherein the at least one first trace, the at least one second trace, and the at least one third trace are disposed in sequence.

14. The memory device of claim 10, wherein the at least one second trace comprises a plurality of second traces, and one of the plurality of second traces is disposed at an outermost side of the assist circuit.

15. The memory device of claim 14, wherein the at least one first trace is disposed between two of the plurality of second traces.

16. The memory device of claim 14, wherein the at least one third trace is disposed between two of the plurality of second traces.

17. A memory device, comprising:
a first inverter;
a second inverter coupled to the first inverter at a node coupled to a bit line; and a pull down circuit configured to pull down a first voltage of the node through a control transistor coupled to the bit line and configured to pull down a power supply voltage provided to the first inverter and the second inverter.

18. The memory device of claim 17, wherein the pull down circuit is configured to pull down the first voltage and the power supply voltage independently.

19. The memory device of claim 17, wherein the pull down circuit is configured to pull down the first voltage and the power supply voltage simultaneously.

20. The memory device of claim 17, wherein a first current outputted from the node rises in response to the first voltage of the node being pulled down, and a second current inputted into the node decreases in response to the power supply voltage provided to the first inverter and the second inverter being pulled down.

*     *     *     *     *